(12) United States Patent
Lee et al.

(10) Patent No.: US 10,454,163 B2
(45) Date of Patent: Oct. 22, 2019

(54) GROUND LAYER DESIGN IN A PRINTED CIRCUIT BOARD (PCB)

(71) Applicant: Intel Corporation, Santa Clara, CA (US)

(72) Inventors: JaeJin Lee, Hillsboro, OR (US);
Dong-Ho Han, Beaverton, OR (US);
Hao-Han Hsu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 15/713,286

(22) Filed: Sep. 22, 2017

(65) Prior Publication Data

US 2019/0097313 A1 Mar. 28, 2019

(51) Int. Cl.

| H05K 1/02 | (2006.01) |
|---|---|
| H01Q 1/52 | (2006.01) |
| H01Q 1/48 | (2006.01) |
| H01Q 1/24 | (2006.01) |
| H01Q 1/27 | (2006.01) |
| H01Q 1/38 | (2006.01) |
| H05K 3/34 | (2006.01) |

(52) U.S. Cl.
CPC ............ *H01Q 1/52* (2013.01); *H01Q 1/242* (2013.01); *H01Q 1/273* (2013.01); *H01Q 1/38* (2013.01); *H01Q 1/48* (2013.01); *H05K 1/0225* (2013.01); *H05K 3/3436* (2013.01); *H05K 2201/09681* (2013.01); *H05K 2201/10098* (2013.01)

(58) Field of Classification Search
CPC ......... H05K 1/0224; H05K 2201/1003; H05K 1/165; H05K 1/181; H05K 3/10; H05K 3/303; H05K 3/4007; H05K 2201/09227; H03H 7/0138; H01L 21/56; H01L 23/12; H01L 23/15; H01L 23/28
See application file for complete search history.

(56) References Cited

U.S. PATENT DOCUMENTS

| 3,904,994 A | * | 9/1975 | Bates | ...................... H01J 23/24 |
| | | | | 315/3.5 |
| 5,747,870 A | * | 5/1998 | Pedder | ................ H01F 17/0006 |
| | | | | 257/528 |
| 2011/0157857 A1 | * | 6/2011 | Matsumoto | .......... H05K 1/0224 |
| | | | | 361/803 |

(Continued)

OTHER PUBLICATIONS

STIC search report. search date Jun. 12, 2019 (Year: 2019)*

*Primary Examiner* — Steven T Sawyer
(74) *Attorney, Agent, or Firm* — Schwabe, Williamson & Wyatt, P.C.

(57) ABSTRACT

Embodiments include apparatuses, methods, and systems including an electronic apparatus including an inductor within a circuit package affixed to a printed circuit board (PCB) having a ground layer, where the ground layer includes a mesh area that is substantially void along a contour of the inductor. An electronic apparatus may include a circuit package with an inductor, and a PCB, where the circuit package may be affixed to the PCB. The PCB may have a plurality of layers including a ground layer and a power layer, where the ground layer may be between the power layer and the inductor. The ground layer may include a mesh area that may be substantially void along a contour of the inductor within the circuit package. Other embodiments may also be described and claimed.

25 Claims, 8 Drawing Sheets

(56) References Cited

U.S. PATENT DOCUMENTS

| | | | |
|---|---|---|---|
| 2013/0027167 A1* | 1/2013 | Sano | H05K 1/181 336/192 |
| 2013/0056847 A1* | 3/2013 | Chen | H01L 28/10 257/531 |
| 2015/0080050 A1* | 3/2015 | Kitajima | H01L 23/642 455/552.1 |
| 2016/0190113 A1* | 6/2016 | Sharan | H01L 28/00 257/531 |
| 2017/0033059 A1* | 2/2017 | Song | H01L 23/585 |
| 2017/0094780 A1* | 3/2017 | Cho | H01F 27/2823 |

* cited by examiner

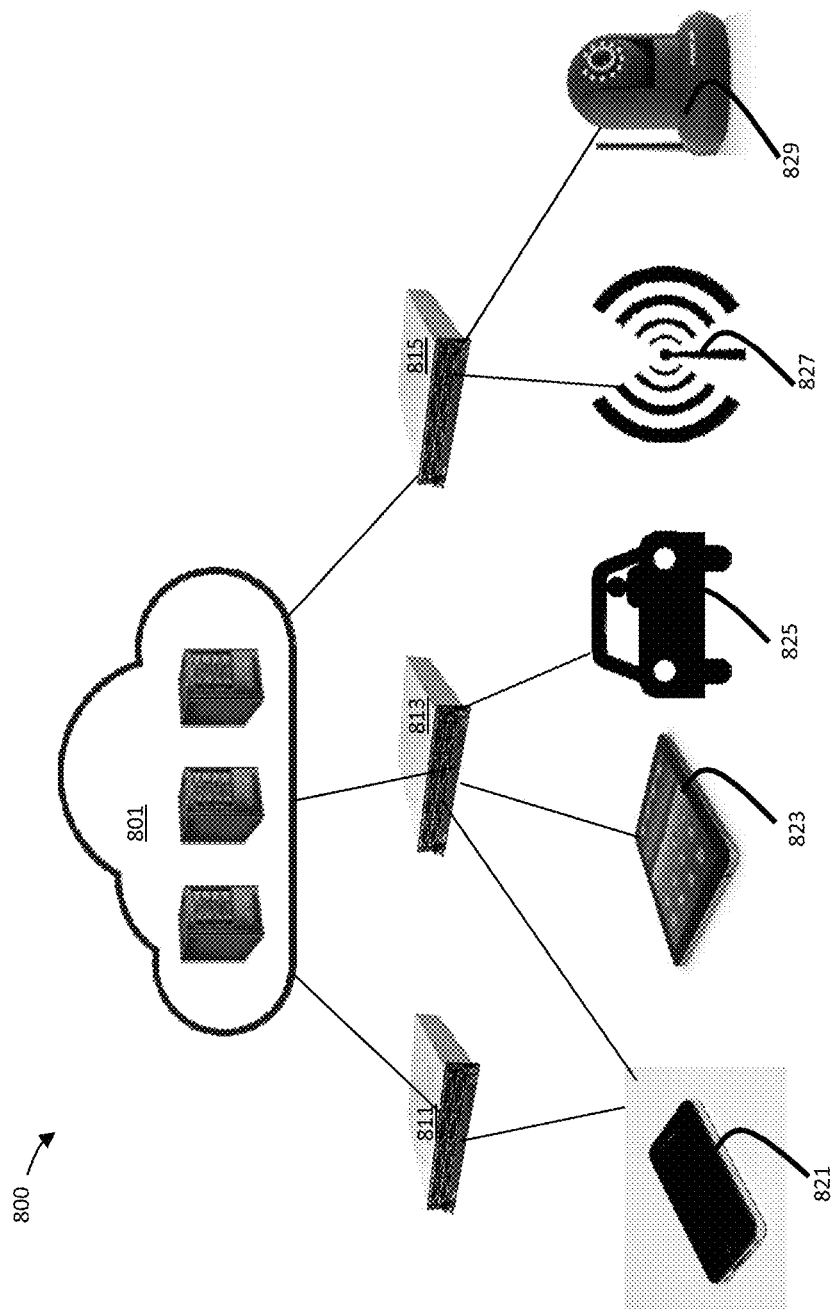

GROUND LAYER DESIGN IN A PRINTED CIRCUIT BOARD (PCB)

FIELD

Embodiments of the present invention relate generally to the technical field of communication and computing, and more particularly to ground layer design in a printed circuit board (PCB) having particular application to client and edge devices.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A circuit package, such as those used in client and edge devices, may be used to protect electronic components within the circuit package from damage. Electronic components, e.g., integrated circuit (IC) chips or dies, system-on-chips (SoC), may be placed into a circuit package to allow easy handling and assembly onto a printed circuit board (PCB) to form an electronic system, an electronic apparatus, or a computing device. Integrated switching voltage regulators (VRs) may offer benefits of power management and PCB design flexibility. However, switching harmonic noise may exist between an inductor of a VR within a circuit package and a power layer of a PCB. Such switching harmonic noise may cause electromagnetic interference (EMI) and radio frequency interference (RFI), leading to throughput degradation and digital signal quality deterioration. Solutions may be desired to reduce the switching harmonic noise between an inductor included in a circuit package and a power layer of a PCB to improve the performance of the electronic apparatus, such as improved throughput and digital signal quality.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 8 illustrates an example computing environment having a number of client devices, or a number of edge devices (traditional or augmented with edge processing capabilities), incorporated with the teachings of the present disclosure, according to various embodiments.

DETAILED DESCRIPTION

Figure 1:
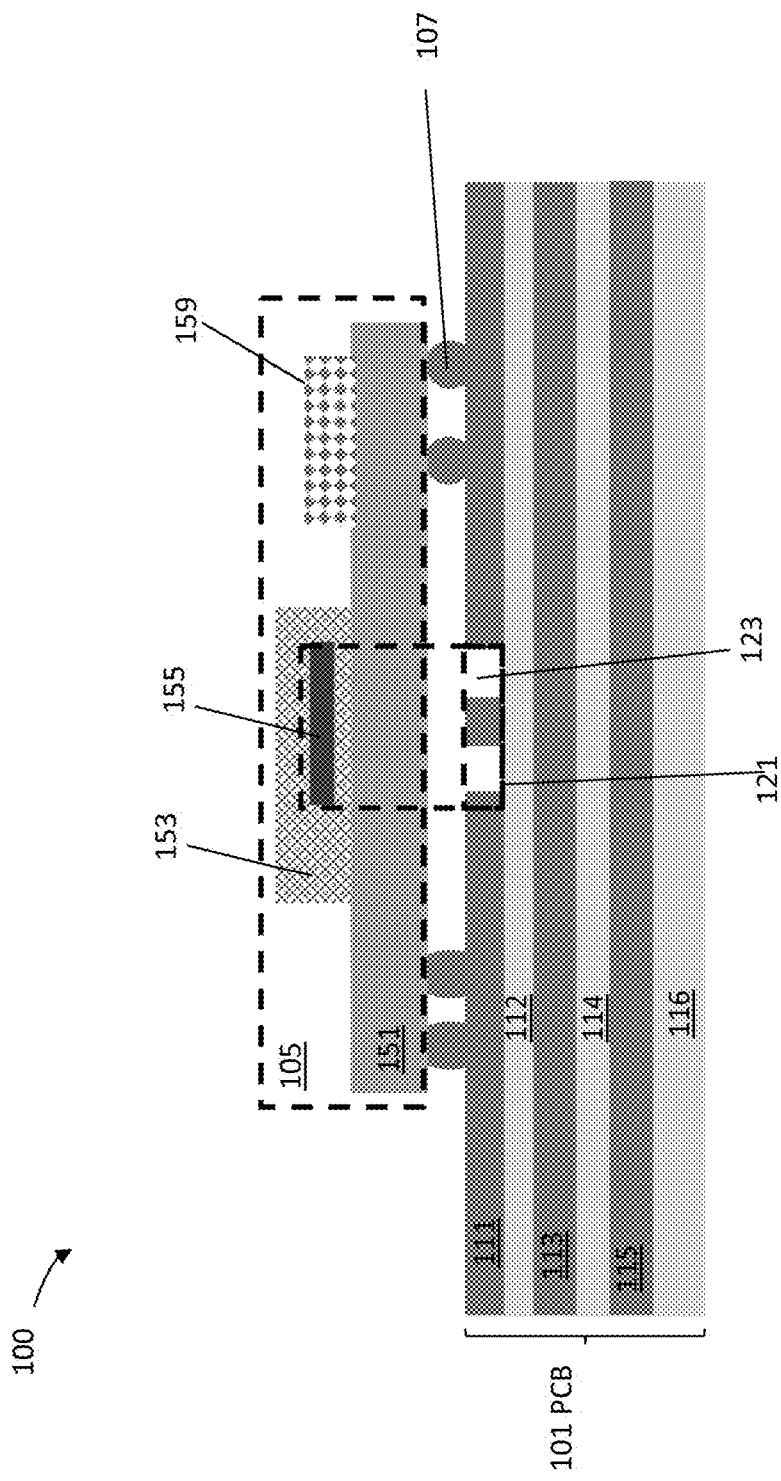
FIG. 1 illustrates a cross-section view of an example electronic apparatus including an inductor within a circuit package affixed to a printed circuit board (PCB) having a ground layer, where the ground layer includes a mesh area that is substantially void along a contour of the inductor, according to various embodiments.

Embodiments of the present disclosure include techniques and configurations for electronic apparatuses and methods for making electronic apparatuses including an inductor within a circuit package affixed to a printed circuit board (PCB) having a ground layer, where the ground layer includes a mesh area that is substantially void along a contour of the inductor. Switching harmonic noise may exist between an inductor within a circuit package and a power layer of a PCB where the circuit package is affixed. A solid ground layer may be placed between the inductor and the power layer of the PCB to block the harmonic noise. However, due to close proximity of the inductor and the ground layer, e.g., 200 μm to 300 μm, Eddy current may be induced, which may reduce the inductance (L) of the inductor. Other designs may extend the distance between the solid ground layer and the inductor, which may lead to increased cost for manufacturing the PCB, and increased z-height for the electronic apparatus including the PCB and the inductor.

In some embodiments, an electronic apparatus may include an inductor within a circuit package affixed to a PCB having a ground layer, where the ground layer may include a mesh area that is substantially void along a contour of the inductor. The mesh area within the ground layer of the PCB may reduce Eddy current induced by the inductor, and may further reducing capacitive and inductive coupling between the inductor and the ground layer of the PCB. As a consequence, an electronic apparatus including a PCB with such a mesh area may have desired inductance (L) of the inductor without increasing the system height, resulting in improvement over a PCB having a solid ground layer. Such an electronic apparatus may offer advantages for new small and thin form-factor converged client and edge devices, mobile devices, or Internet of Things (IOT) devices, e.g., tablets, premium 2-in-1, and wearable devices. In some embodiments, the inductor may be included in a voltage regulator (VR). The VR may be further integrated into a system-on-chip (SoC) to become an integrated VR (IVR). In some other embodiments, the inductor may be a discrete component or a part of any component of a circuit package.

In embodiments, an electronic apparatus may include a circuit package with an inductor, and a PCB, where the circuit package may be affixed to the PCB. The PCB may have a plurality of layers including a ground layer and a power layer, where the ground layer may be between the power layer and the inductor. The ground layer may include a mesh area that may be substantially void along a contour of the inductor within the circuit package.

In embodiments, a PCB may include a substrate and a ground layer on the substrate. The ground layer may include a void area, where the void area may be disposed at a location substantially overlapping along a contour of an inductor within a circuit package, when the circuit package may be affixed to the PCB.

In embodiments, a computing device may include a processor, a display coupled to the processor, a circuit package with an inductor, and a PCB. The circuit package may be affixed to the PCB. The PCB may have a plurality of layers including a ground layer and a power layer, where the ground layer may be between the power layer and the inductor. The ground layer may include a mesh area that is substantially void along a contour of the inductor.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a programmable combinational logic circuit (such as a Field Programmable Gate Array (FPA)), a hardware accelerator, a processor (shared, dedicated, or group) and/or memory (shared, dedicated, or group) that execute one or more software or firmware programs, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD), (for example, a field-programmable gate array (FPGA), a programmable logic device (PLD), a complex PLD (CPLD), a high-capacity PLD (HCPLD), a structured ASIC, or a programmable System on Chip (SoC)), digital signal processors (DSPs), etc., that are configured to provide the described functionality. In some embodiments, the circuitry may execute one or more software or firmware programs to provide at least some of the described functionality.

As used herein, the term "processor circuitry" may refer to, is part of, or includes circuitry capable of sequentially and automatically carrying out a sequence of arithmetic or logical operations; recording, storing, and/or transferring digital data. The term "processor circuitry" may refer to one or more application processors, one or more baseband processors, a physical central processing unit (CPU), a single-core processor, a dual-core processor, a triple-core processor, a quad-core processor, and/or any other device capable of executing or otherwise operating computer-executable instructions, such as program code, software modules, and/or functional processes.

As used herein, the term "interface circuitry" may refer to, is part of, or includes circuitry providing for the exchange of information between two or more components or devices. The term "interface circuitry" may refer to one or more hardware interfaces (for example, buses, input/output (I/O) interfaces, peripheral component interfaces, network interface cards, and/or the like).

As used herein, the term "computer device" or "computing device" may describe any physical hardware device capable of sequentially and automatically carrying out a sequence of arithmetic or logical operations, equipped to record/store data on a machine readable medium, and transmit and receive data from one or more other devices in a communications network. A computer device may be considered synonymous to, and may hereafter be occasionally referred to, as a computer, computing platform, computing device, etc. The term "computer system" may include any type interconnected electronic devices, computer devices, or components thereof. Additionally, the term "computer system" and/or "system" may refer to various components of a computer that are communicatively coupled with one another. Furthermore, the term "computer system" and/or "system" may refer to multiple computer devices and/or multiple computing systems that are communicatively coupled with one another and configured to share computing and/or networking resources. Examples of "computer devices", "computer systems", etc. may include cellular phones or smart phones, feature phones, tablet personal computers, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, an Instrument Cluster (IC), head-up display (HUD) devices, onboard diagnostic (OBD) devices, dashtop mobile equipment (DME), mobile data terminals (MDTs), Electronic Engine Management System (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle.

FIG. 1 illustrates a cross-section view of an example electronic apparatus 100 including an inductor 155 within a circuit package 105 affixed to a PCB 101 having a ground layer 111, where the ground layer 111 includes a mesh area 121 that is substantially void along a contour of the inductor 155, according to various embodiments. For clarity, features of an inductor, e.g., the inductor 155, a PCB, e.g., the PCB 101, or a circuit package, e.g., the circuit package 105, may be described below as examples for understanding an example inductor, an example PCB, and/or an example circuit package. It is to be understood that there may be more or fewer components within an inductor, a PCB, and/or a circuit package. Further, it is to be understood that one or more of the components within the inductor, the PCB, and/or the circuit package, may include additional and/or varying features from the description below, and may include any device that one having ordinary skill in the art would consider and/or refer to as an inductor, a PCB, and/or a circuit package.

In embodiments, the electronic apparatus 100 may include the PCB 101. The PCB 101 may include multiple layers, e.g., the ground layer 111, a signal layer 113, a power layer 115, a dielectric layer 112, a dielectric layer 114, a dielectric layer 116, and other conductive layers and dielectric layers. The ground layer 111 may be between the power layer 115 and the inductor 155, to block the harmonic noise between the inductor 155 and the power layer 115. The ground layer 111 may include the mesh area 121 that is substantially void, e.g., including a void area 123, along a contour of the inductor 155. The circuit package 105 may be affixed to the PCB 101 through connectors 107. In addition, the circuit package 105 may include a package substrate 151. A component 153 and a component 159 may be placed on the package substrate 151, while the inductor 155 may be included in the component 153. In some embodiments, the component 153 may be a VR. The component 153, e.g., a VR, and the component 159, e.g., a processor, may be a part of a system-on-chip (SoC).

In embodiments, the electronic apparatus 100 may be any one of a number of mobile and/or non-mobile client or edge devices. A mobile client device may include, but is not to be limited to, for example, a laptop computer, an ultra-laptop computer, a tablet, a touch pad, a portable computer, a handheld computer, a wearable device, a palmtop computer, a personal digital assistant (PDA), an e-reader, a cellular telephone, a combination cellular telephone/PDA, a mobile smart device (e.g., a smart phone, a smart tablet, etc.), a mobile internet device (MID), a mobile messaging device, a mobile data communication device, a mobile media playing device, a camera, a mobile gaming console, etc. A non-mobile client or edge devices may include, but is not to be limited to, for example, a personal computer (PC), a television, a smart television, a data communication device, a media playing device, a gaming console, a gateway, an Internet of Things (JOT) device, etc. The electronic apparatus 100 may include controllers (or processors) and other components that execute software and/or control hardware to execute local programs or consume services provided by external service providers over a network. For example, the electronic apparatus 100 may include one or more software clients or applications that run locally and/or utilize or access web-based services (e.g., online stores or services, social networking services, etc.). The electronic apparatus 100 may also, or instead, include a web interface running in a browser from which the electronic apparatus can access such web-based services. The electronic apparatus 100 may also include storage devices to store logic and data associated with the programs and services used by the electronic apparatus 100.

In embodiments, the PCB 101 may mechanically support and electrically connect electronic components, e.g., the circuit package 105, using conductive tracks, pads and other features etched from copper sheets or other metal sheets laminated onto a non-conductive substrate. In embodiments, the PCB 101 may be a motherboard with expansion capability so that various components or packages may be attached to the PCB. For example, circuit packages attached to the PCB 101 may include peripherals, interface cards, TV tuner cards, or cards providing extra USB or FireWire slots. The PCB 101 may also include daughter cards attached to the PCB 101, where the daughter cards may include sound cards, video cards, network cards, hard drives, or other forms of persistent storage, or a variety of other custom components or packages. In some embodiments, the PCB 101 may be a mainboard, which may be a single board with limited or no additional expansion capability, such as controlling boards in laser printers, televisions, washing machines, or other embedded systems with limited expansion abilities.

In embodiments, the PCB 101 may be a multi-layer board with outer and inner layers. The PCB may be of a circular shape, a square, a rectangular shape, an elliptical shape, or a polygon shape. In embodiments, the PCB 101 may be a multi-layer board including a plurality of layers, such as the ground layer 111, the signal layer 113, the power layer 115, the dielectric layer 112 between the ground layer 111 and the signal layer 113, the dielectric layer 114 between the signal layer 113 and the power layer 115, and the dielectric layer 116. In embodiments, the dielectric layer 112, the dielectric layer 114, or the dielectric layer 116 may be a woven glass reinforced layer, or a non-woven glass reinforced layer. The dielectric layer 112, the dielectric layer 114, or the dielectric layer 116 may include a material that may be a poor conductor of electricity, such as porcelain, mica, glass, plastics and some metal oxides. In embodiments, the ground layer 111, the signal layer 113, the power layer 115, may include a conductive metal or an alloy of metal, such as aluminum, copper, and/or steel alloy, or other conductive metal.

In embodiments, the ground layer 111 may be a top metal layer of the PCB 101 that is closest to the inductor 155, while the power layer 115 may be at a bottom metal layer of the PCB 101, to reduce the harmonic noise between the inductor 155 and the power layer 115. Hence, the signal layer 113 may be located below the ground layer 111, similar to the power layer 115. In some embodiments, there may be only the power layer 115 and the ground layer 111 without the signal layer 113.

In embodiments, the circuit package 105 may be affixed to the PCB 101 by one or more connectors 107. In embodiments, the circuit package 105 may be a chip scale package (CSP), a wafer-level package (WLP), a multi-chip package (MCP), a quad-flat no-leads (QFN) package, a dual-flat no-leads (DFN) package, a flip chip package, a ball grid array (BGA) package, or a package with overmold mounted on the PCB. A CSP may be a flip chip device including solder balls or bumps that are approximately 250 um tall. A wafer-level package may be a circuit package at a wafer level, instead of individual dies obtained from dicing them from a wafer. Both QFN and DFN packages may refer to packages that connect ICs to the surfaces of PCBs without through-holes.

In embodiments, the circuit package 105 may include the package substrate 151. In embodiments, the package substrate 151 may be a polymeric substrate, a non-polymeric substrate, a silicon substrate, a silicon on insulator (SOI) substrate, or a silicon on sapphire (SOS) substrate, among various other substrate materials. The component 153 and the component 159 may be placed on the package substrate 151. In some embodiments, the component 153 may be a VR, a fully integrated voltage regulator (FIVR), or a multi-chip integrated voltage regulator (McIVR), while the component 159 may be a processor. The inductor 155 may be an inductor in a VR. Other components, such as active devices, or passive devices such as capacitors, resistors, may be included in the circuit package 105, not shown. Additionally and alternatively, fewer components may be included in the circuit package 105, without the component 159. In some embodiments, the inductor 155 may be included in a VR, and the VR may be further integrated into a system-on-chip (SoC) to become an integrated VR (IVR). In some other embodiments, the inductor 155 may be a discrete component or a part of any component of a circuit package.

In embodiments, the circuit package 105 may be coupled to the PCB 101 by the connectors 107. One or more such connectors 107 may be used to make the connection between the circuit package 105 and the PCB 101. In embodiments, the connectors 107 may be a stud, a wire-bonding wire, a bump, a ball, a solder pillar, or others. For example, the connector 107 may include one or more solder balls, where the solder balls may include solder alloy such as tin-lead (Sn—Pb) solders or lead free solders such as tin/silver/copper or some other lead-free solder. In addition, the circuit package 105 may include more materials or components not shown. For example, the circuit package 105 may include an underfill layer between the component 153 and the package substrate 151.

In embodiments, the inductor 155 may be an air core inductor (ACI), a ferromagnetic core inductor, a variable inductor, or other kinds of inductor. The inductor 155 may include various wires or material. For example, the inductor 155 may include round copper wire, copper or aluminum in sheet, square wire, rectangular wire, or Litz wire. The ground layer 111 may include the mesh area 121 that is substantially void along a contour of the inductor 155. In detail, the mesh area 121 may include a void area 123 that may have a substantially identical shape as a shape of the coil of the inductor 155. Furthermore, the mesh area 121 may be vertically below the inductor 155. Since the mesh area 121 may have the void area 123, the surface of the ground layer 111 in parallel to the inductor 155 may be reduced, resulting in reduced Eddy current, reduced capacitive and inductive coupling between the inductor 155 and the ground layer 111. More details of an exemplary inductor and an exemplary mesh area of a ground layer may be illustrated in FIG. 2-FIG. 5.

Figure 2:
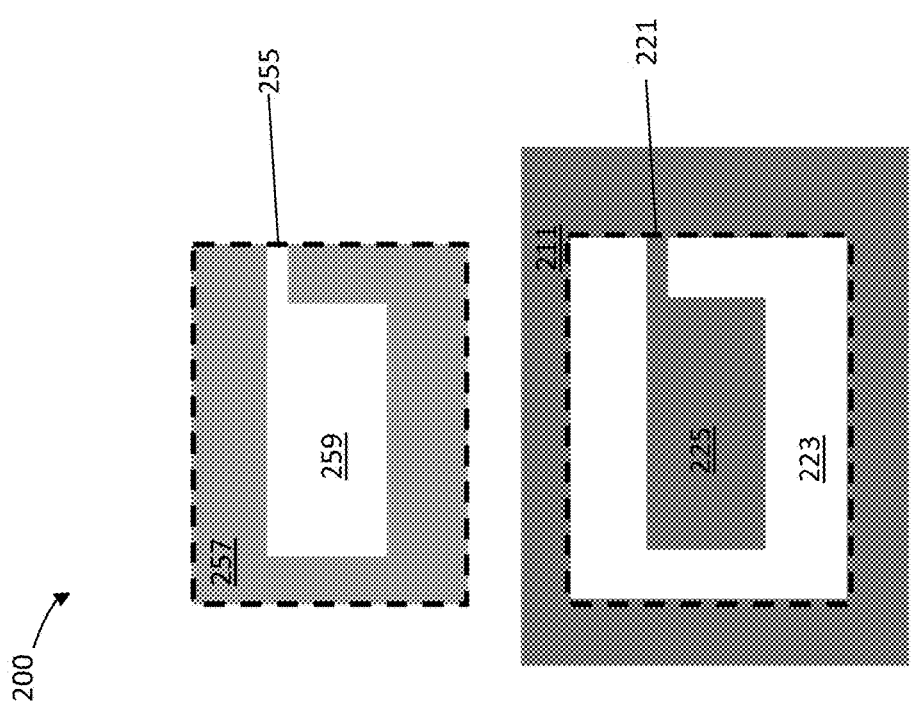
FIG. 2 illustrates a top view of an example electronic apparatus including an inductor and a ground layer including a mesh area that is substantially void along a contour of the inductor, according to various embodiments.

FIG. 2 illustrates a top view of an example electronic apparatus 200 including an inductor 255 and a ground layer 211 including a mesh area 221 that is substantially void along a contour of the inductor 255, according to various embodiments. In embodiments, the electronic apparatus 200 may be an example of the electronic apparatus 100, the ground layer 211 may be an example of the ground layer 111, the mesh area 221 may be an example of the mesh area 121, and the inductor 255 may be an example of the inductor 155, shown in FIG. 1.

In embodiments, the inductor 255 may include a coil 257 and a core 259. The coil 257 may include a conductive metal or an alloy of metal, such as a wire, which is wound around the core 259. The coil 257 may include various wires or material. For example, the coil 257 may include round copper wire, copper or aluminum in sheet, square wire, rectangular wire, or Litz wire. For example, the coil 257 may include a rectangular wire, having a width in a range of about 1.0 millimeter (mm) to about 1.5 mm, and a height in a range of about 0.1 mm to 0.5 mm. A contour of the inductor 255 may be the trace of the coil 257. In embodiments, the inductor 255 may be included in a circuit package, e.g., the circuit package 105, affixed to a PCB, e.g. the PCB 101, directly above a mesh area of the ground layer, e.g., the ground layer 111 of the PCB 101.

In embodiments, the ground layer 211 may be similar to the ground layer 111, and included in a PCB, e.g., the PCB 101. The ground layer 211 may include a conductive metal or an alloy of metal, such as aluminum, copper, and/or steel alloy, or other conductive metal. The ground layer 211 may include the mesh area 221. The mesh area 221 may include a void area 223 and a core area 225 attached to the boundary of the ground layer 211. The mesh area 221 and the void area 223 may be similar to the mesh area 121 and the void area 123 shown in FIG. 1. In embodiments, the void area 223 may be disposed at a location that substantially overlaps along a contour of an inductor within a circuit package, when the circuit package is affixed to the PCB. For example, the void area 223 may substantially overlap along the coil 257 of the inductor 255, when the inductor 255 is included in a circuit package affixed to the PCB containing the ground layer 211.

Figure 3:
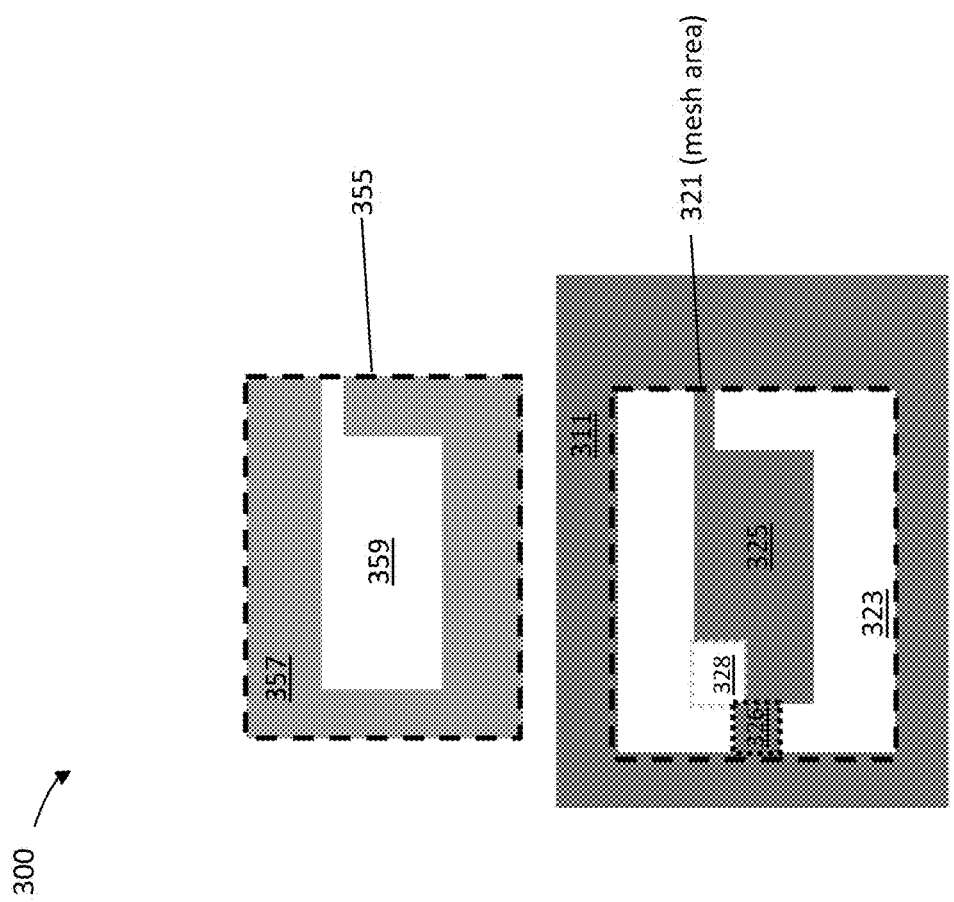
FIG. 3 illustrates a top view of another example electronic apparatus including an inductor and a ground layer including a mesh area that is substantially void along a contour of the inductor, according to various embodiments.

FIG. 3 illustrates a top view of another example electronic apparatus 300 including an inductor 355 and a ground layer 311 including a mesh area 321 that is substantially void along a contour of the inductor 355, according to various embodiments. In embodiments, the electronic apparatus 300 may be an example of the electronic apparatus 100, the ground layer 311 may be an example of the ground layer 111, the mesh area 321 may be an example of the mesh area 121, and the inductor 355 may be an example of the inductor 155, shown in FIG. 1.

In embodiments, the inductor 355 may include a coil 357 and a core 359. The coil 357 may include a conductive metal or an alloy of metal, such as a wire, which is wound around the core 359. The coil 357 may include various wires or material. For example, the coil 357 may include round copper wire, copper or aluminum in sheet, square wire, rectangular wire, or Litz wire. For example, the coil 357 may include a rectangular wire, having a width in a range of about 1.0 millimeter (mm) to about 1.5 mm, and a height in a range of about 0.1 mm to 0.5 mm. A contour of the inductor 355 may be the trace of the coil 357. In embodiments, the inductor 355 may be included in a circuit package, e.g., the circuit package 105, affixed to a PCB, e.g. the PCB 101, directly above a mesh area of the ground layer, e.g., the ground layer 111 of the PCB 101.

In embodiments, the ground layer 311 may be similar to the ground layer 111, and included in a PCB, e.g., the PCB 101. The ground layer 311 may include a conductive metal or an alloy of metal, such as aluminum, copper, and/or steel alloy, or other conductive metal. The ground layer 311 may include the mesh area 321. The mesh area 321 may include a void area 323 and a core area 325 attached to the boundary of the ground layer 211. The mesh area 321 and the void area 323 may be similar to the mesh area 121 and the void area 123 shown in FIG. 1. In embodiments, the void area 323 may be disposed at a location that substantially overlaps along a contour of an inductor within a circuit package, when the circuit package is affixed to the PCB. For example, the void area 323 may substantially overlap along the coil 357 of the inductor 355, when the inductor 355 is included in a circuit package affixed to the PCB containing the ground layer 311.

In embodiments, the void area 323 may not be identical to the trace of the coil 357. For example, the void area 323 may be divided by an area 326 on the ground layer 311, which may be attached to the boundary of the ground layer 311. The area 326 may fall within the trace of the coil 357, but the area 326 remains on the ground layer 311. On the other hand, the void area 323 may include an area 328, which may not fall within the trace of the coil 357. The ground layer 311 may include the area 326 but without the area 328, and may still achieve the desired objectives, to reduce Eddy current, reduce capacitive and inductive coupling between the inductor 355 and the ground layer 311. Detailed design of the ground layer 311 may depend on the applications the electronic apparatus 300 is used.

Figure 4:
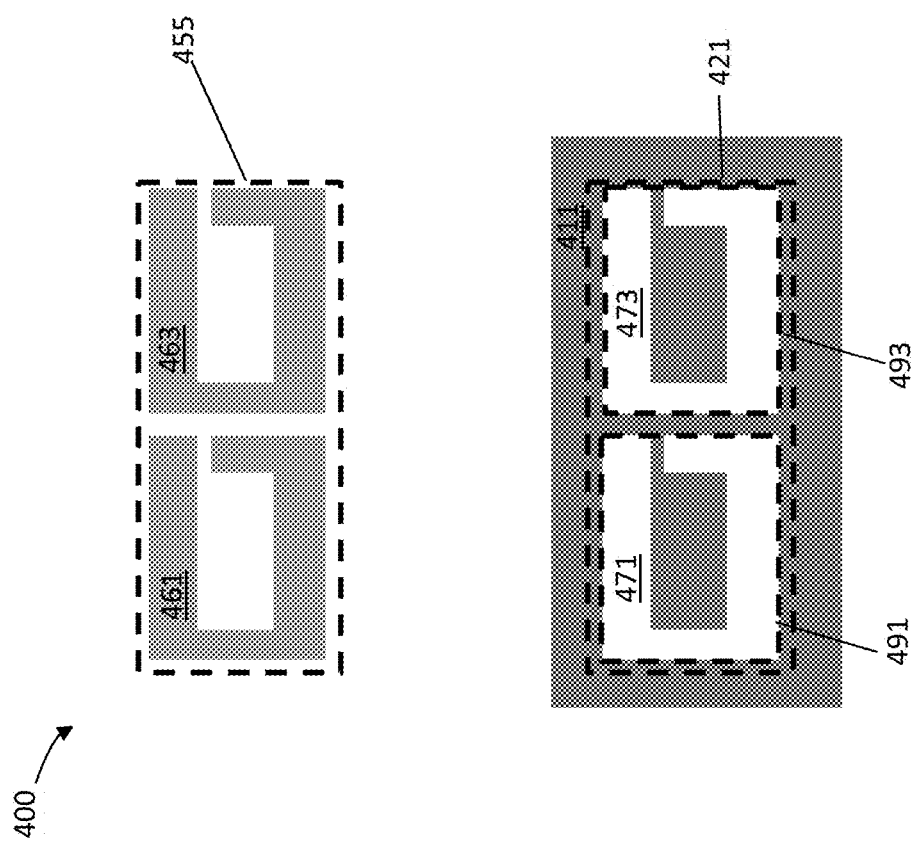
FIG. 4 illustrates a top view of another example electronic apparatus including an inductor and a ground layer including a mesh area that is substantially void along a contour of the inductor, according to various embodiments.

FIG. 4 illustrates a top view of another example electronic apparatus 400 including an inductor 455 and a ground layer 411 including a mesh area 421 that is substantially void along a contour of the inductor 455, according to various embodiments. In embodiments, the electronic apparatus 400 may be an example of the electronic apparatus 100, the ground layer 411 may be an example of the ground layer 111, the mesh area 421 may be an example of the mesh area 121, and the inductor 455 may be an example of the inductor 155, shown in FIG. 1.

In embodiments, the inductor 455 may include a first coil segment 461 and a second coil segment 463, where the first coil segment 461 may be disjoint from the second coil segment 463. The first coil segment 461 or the second coil segment 463 may include a conductive metal or an alloy of metal, such as a wire. For example, the first coil segment 461 or the second coil segment 463 may include round copper wire, copper or aluminum in sheet, square wire, rectangular wire, or Litz wire. For example, the first coil segment 461 or the second coil segment 463 may include a rectangular wire, having a width in a range of about 1.0 millimeter (mm) to about 1.5 mm, and a height in a range of about 0.1 mm to 0.5 mm. A contour of the inductor 455 may include the trace of the first coil segment 461 and the trace of the second coil segment 463. In embodiments, the inductor 455 may be included in a circuit package, e.g., the circuit package 105, affixed to a PCB, e.g. the PCB 101, directly above a mesh area of the ground layer, e.g., the ground layer 111 of the PCB 101.

In embodiments, the ground layer 411 may be similar to the ground layer 111, and included in a PCB, e.g., the PCB 101. The ground layer 411 may include a conductive metal or an alloy of metal, such as aluminum, copper, and/or steel alloy, or other conductive metal. The ground layer 411 may include the mesh area 421. The mesh area 421 may be similar to the mesh area 121 shown in FIG. 1. The mesh area 421 may include a first mesh area 491 and a second mesh area 493.

The first mesh area 491 may include a void area 471, and the second mesh area 493 may include a void area 473. In embodiments, the void area 471 may be disposed at a location that substantially overlaps along the trace of the first coil segment 461, and the void area 473 may be disposed at a location that substantially overlaps along the trace of the second coil segment 463. In some embodiments, the void area 471 may have a shape identical to the first coil segment 461. In some other embodiments, the void area 471 may have a shape not identical but substantially identical to the first coil segment 461, as shown in FIG. 3. The design of the mesh area 421, the void area 471, and the void area 473 may be for the objectives to reduce Eddy current, reduce capacitive and inductive coupling between the inductor 455 and the ground layer 411. Detailed design of the ground layer 411 may depend on the applications the electronic apparatus 400 is used.

Figure 5:
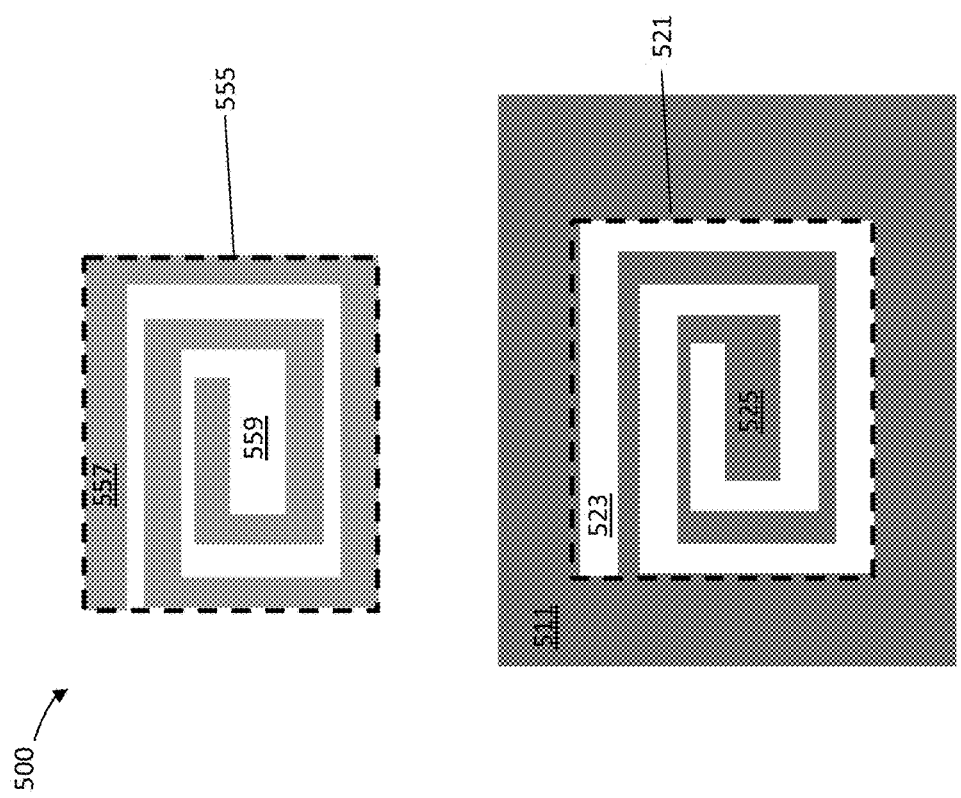
FIG. 5 illustrates a top view of another example electronic apparatus including an inductor and a ground layer including a mesh area that is substantially void along a contour of the inductor, according to various embodiments.

FIG. 5 illustrates a top view of another example electronic apparatus 500 including an inductor 555 and a ground layer 511 including a mesh area 521 that is substantially void along a contour of the inductor 555, according to various embodiments. In embodiments, the electronic apparatus 500 may be an example of the electronic apparatus 100, the ground layer 511 may be an example of the ground layer 111, the mesh area 521 may be an example of the mesh area 121, and the inductor 555 may be an example of the inductor 155, shown in FIG. 1.

In embodiments, the inductor 555 may include a coil segment 557 and a core 559. The coil 557 may be a spiral coil, including a conductive metal or an alloy of metal, such as a wire, which is wound around the core 259. In embodiments, the coil 457 may include be round copper wire, copper or aluminum in sheet, square wire, rectangular wire, or Litz wire. A contour of the inductor 555 may be the trace of the spiral coil 557. In embodiments, the inductor 555 may be included in a circuit package, e.g., the circuit package 105, affixed to a PCB, e.g. the PCB 101, directly above a mesh area of the ground layer, e.g., the ground layer 111 of the PCB 101.

In embodiments, the ground layer 511 may be similar to the ground layer 111, and included in a PCB, e.g., the PCB 101. The ground layer 511 may include a conductive metal or an alloy of metal, such as aluminum, copper, and/or steel alloy, or other conductive metal. The ground layer 511 may include the mesh area 521. The mesh area 521 may be similar to the mesh area 121 shown in FIG. 1. The mesh area 521 may include a void area 523 and a core area 525 attached to the boundary of the ground layer 511. The mesh area 521 and the void area 523 may be similar to the mesh area 121 and the void area 123 shown in FIG. 1. In embodiments, the void area 523 may be disposed at a location that substantially overlaps along a contour of the inductor 555, e.g., the trace of the coil 557, within a circuit package, when the circuit package is affixed to the PCB. For example, the void area 523 may substantially overlap along the trace of the coil 557 of the inductor 555, when the inductor 555 is included in a circuit package affixed to the PCB containing the ground layer 511. The design of the mesh area 521 and the void area 523 may be for the objectives to reduce Eddy current, reduce capacitive and inductive coupling between the inductor 555 and the ground layer 511. Detailed design of the ground layer 511 may depend on the applications the electronic apparatus 500 is used.

Figure 6:
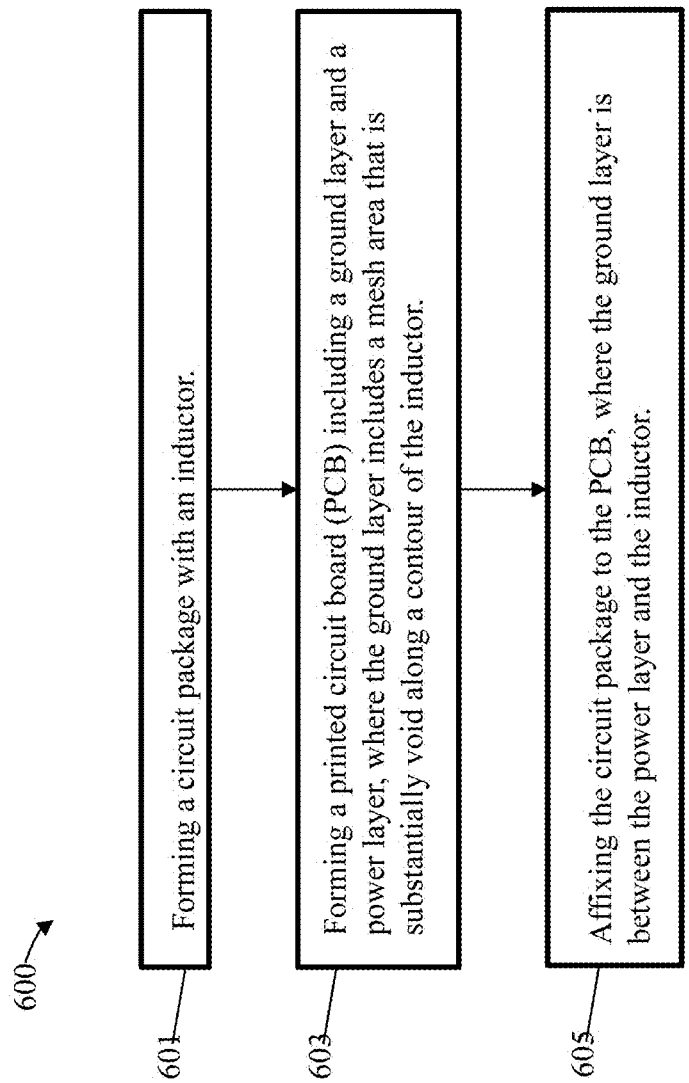
FIG. 6 illustrates a process for making an electronic apparatus, according to various embodiments.

FIG. 6 illustrates a process 600 for making an electronic apparatus, according to various embodiments. In embodiments, the process 600 may be a process performed to make the electronic apparatus 100 as shown in FIG. 1, the electronic apparatus 200 as shown in FIG. 2, the electronic apparatus 300 as shown in FIG. 3, the electronic apparatus 400 as shown in FIG. 4, or the electronic apparatus 500 as shown in FIG. 5.

The process 600 may start at an interaction 601. During the interaction 601, operations may be performed to form a circuit package with an inductor. For example, at the interaction 601, the circuit package 105 may be formed, which may include the inductor 155.

During an interaction 603, operations may be performed to form a PCB including a ground layer and a power layer, where the ground layer includes a mesh area that is substantially void along a contour of the inductor. For example, at the interaction 603, the PCB 101 may be formed including the ground layer 111 and the power layer 115. The ground layer 111 includes the mesh area 121 that is substantially void along a contour of the inductor 155.

During an interaction 605, operations may be performed to affix the circuit package to the PCB, where the ground layer is between the power layer and the inductor. For example, at the interaction 605, the circuit package 105 may be affixed to the PCB 101, where the ground layer 111 is between the power layer 115 and the inductor 155.

Figure 7:
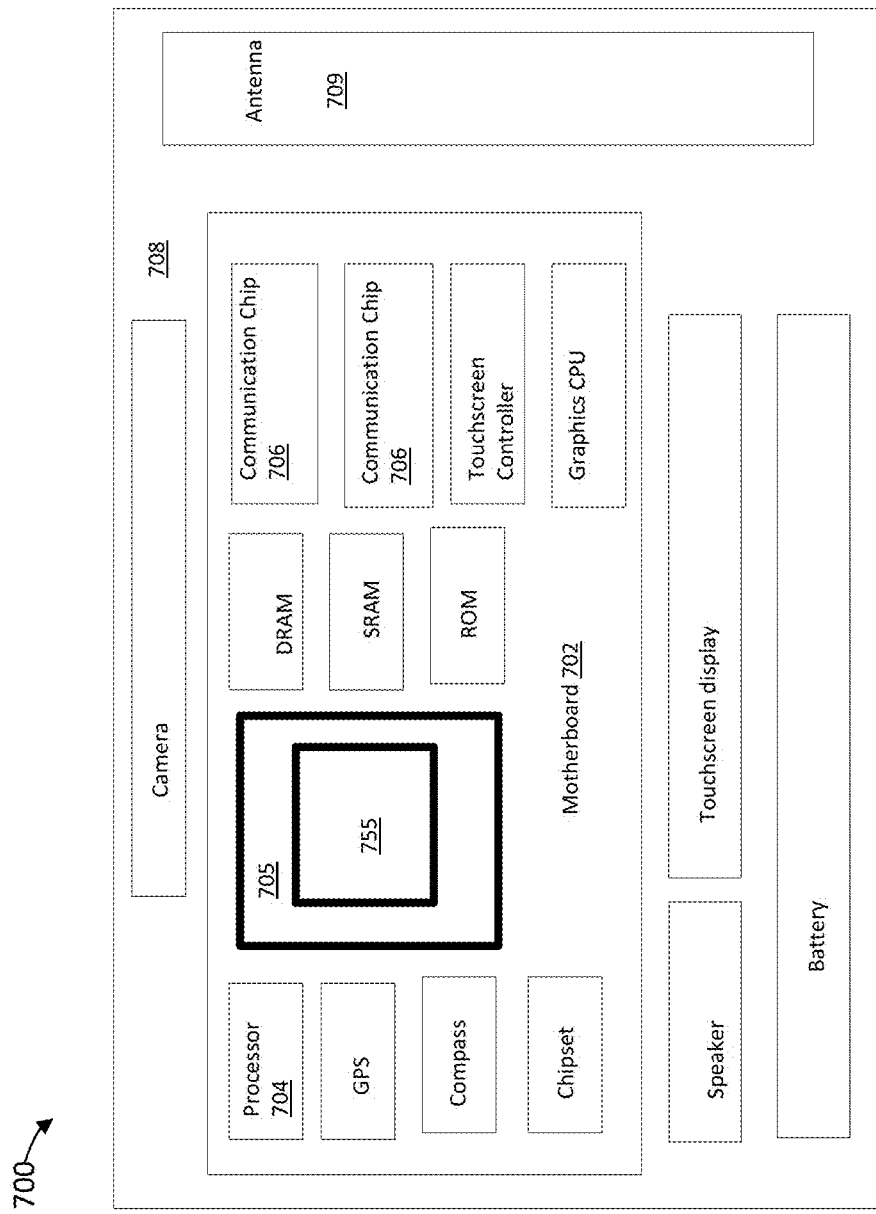
FIG. 7 illustrates an example computing device that may employ the apparatuses and/or methods described herein, according to various embodiments.

FIG. 7 illustrates an example computing device 700 that may employ the apparatuses and/or methods described herein (e.g., the computing device 700 assembled on a motherboard 702, which may be a PCB, with circuit packages), according to various embodiments. In embodiments, an inductor 755 may be included in a circuit package 705 affixed to the motherboard 702. In embodiments, the motherboard 702 may be an example of the PCB 101, the inductor 755 may be an example of the inductor 155, and the circuit package 705 may be an example of the circuit package 105, shown in FIG. 1. The motherboard 702 may include a mesh area below the inductor 755 that is substantially void along a contour of the inductor 755, not shown.

Components of the computing device 700 may be housed in an enclosure (e.g., housing 708). The motherboard 702 may include a number of components, including but not limited to a processor 704 and at least one communication chip 706. The processor 704 may be physically and electrically coupled to the motherboard 702. In some implementations, at least one communication chip 706 may also be physically and electrically coupled to the motherboard 702. In further implementations, the communication chip 706 may be part of the processor 704. In addition, the computing device 700 may further include an antenna 709 outside the motherboard 702.

Depending on its applications, the computing device 700 may include other components that may or may not be physically and electrically coupled to the motherboard 702. These other components may include, but are not limited to, volatile memory (e.g., DRAM), static random access memory (SRAM), non-volatile memory (e.g., ROM), flash memory, a graphics central processing unit (CPU), a digital signal processor, a crypto processor, a chipset, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). These components may be included in circuit packages, e.g., the circuit package 105 as shown in FIG. 1. The components, such as the processor 704, the communication chip 706, DRAM, SRAM, ROM, GPS, may have different heights.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, EV-DO, and others.

In various implementations, the computing device 700 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

FIG. 8 illustrates an example computing environment 800 having a number of client devices, e.g., a smartphone 821, a tablet 823, an onboard vehicle infotainment system 825, a wireless communication router 827, or a virtual personal assistant 829, or a number of edge devices, e.g., routers, switches or gateways 811-815 (traditional or augmented with edge processing capabilities), incorporated with the teachings of the present disclosure, according to various embodiments. In embodiments, the client devices 821-829, or the edge devices 811-815 may be the electronic apparatus 100 as shown in FIG. 1, the electronic apparatus 200 as shown in FIG. 2, the electronic apparatus 300 as shown in FIG. 3, the electronic apparatus 400 as shown in FIG. 4, the electronic apparatus 500 as shown in FIG. 5, or the computing device 700 as shown in FIG. 7.

In embodiments, a client device, e.g., one of client devices 821-829, may communicate with an edge device, e.g., one or edge devices 811-815, by various communication technology. Furthermore, an edge device, e.g., one of edge devices 811-815, may communicate with the cloud 801 having a number of remote cloud servers.

In embodiments, a client device, e.g., one of client devices 821-829, may collect various data. A client device may be a device that may not be continuously connected to a network or an edge device. An edge device, e.g., one of edge devices 811-815, may perform data processing at the edge of the network, near the source of the data. This reduces the communications bandwidth needed between a client device and the cloud, e.g., a central data center, by performing analytics and knowledge generation at or near the source of the data. An edge device may have full, uninterrupted access to the cloud 801 capable of processing and transmitting data quickly to the client device.

In embodiments, the client devices 821-829, and the edge devices 811-815, may be a part of wireless sensor network, a mobile data acquisition network, a cooperative distributed peer-to-peer ad hoc network, a local cloud/fog computing network, a grid/mesh computing network, a dew computing network, a mobile edge computing network, a cloudlet, a distributed data storage and retrieval network, an autonomic self-healing network, an augmented reality network, or other network.

In embodiments, the client devices 821-829, and the edge devices 811-815, may be a computing system. In addition to the depicted examples, the client devices 821-829 or the edge devices 811-815 may include, wearable computing devices, an autonomous sensors, laptop computers, desktop personal computers, video game consoles, digital media players, handheld messaging devices, personal data assistants, an electronic book readers, augmented reality devices, server computer devices (e.g., stand-alone, rack-mounted, blade, etc.), cloud computing services/systems, network elements, in-vehicle infotainment (IVI), in-car entertainment (ICE) devices, vehicle-embedded computer device, an Instrument Cluster (IC), head-up display (HUD) devices, onboard diagnostic (OBD) devices, dashtop mobile equipment (DME), mobile data terminals (MDTs), electronic engine management system (EEMS), electronic/engine control units (ECUs), electronic/engine control modules (ECMs), embedded systems, microcontrollers, control modules, engine management systems (EMS), networked or "smart" appliances, machine-type communications (MTC) devices, machine-to-machine (M2M), Internet of Things (IoT) devices, and/or any other like electronic devices. Moreover, the term "vehicle-embedded computer device" may refer to any computer device and/or computer system physically mounted on, built in, or otherwise embedded in a vehicle. Each of these devices may include one or more electronic components have the EMI shielding teaching of the disclosure, earlier described with references to FIGS. 1-6.

Thus various example embodiments of the present disclosure have been described including, but are not limited to:

Example 1 may include an electronic apparatus, comprising: a circuit package with an inductor; a printed circuit board (PCB), wherein the circuit package is affixed to the PCB, the PCB has a plurality of layers including a ground layer and a power layer, and wherein the ground layer is between the power layer and the inductor, the ground layer includes a mesh area that is substantially void along a contour of the inductor.

Example 2 may include the electronic apparatus of example 1 and/or some other examples herein, wherein the ground layer includes a conductive metal or an alloy of metal.

Example 3 may include the electronic apparatus of any one of examples 1-2 and/or some other examples herein, wherein the ground layer is a top metal layer of the PCB that is closest to the inductor.

Example 4 may include the electronic apparatus of any one of examples 1-2 and/or some other examples herein, wherein the PCB further includes a signal layer located at a same side of the ground layer as the power layer is located.

Example 5 may include the electronic apparatus of any one of examples 1-2 and/or some other examples herein, wherein the PCB is of a circular shape, a square, a rectangular shape, an elliptical shape, or a polygon shape.

Example 6 may include the electronic apparatus of any one of examples 1-2 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 7 may include the electronic apparatus of any one of examples 1-2 and/or some other examples herein, wherein the inductor includes a first coil segment and a second coil segment disjoint from the first coil segment, and the ground layer includes a first mesh area and a second mesh area, and wherein the first mesh area is substantially void along a contour of the first coil segment, and the second mesh area is substantially void along a contour of the second coil segment.

Example 8 may include the electronic apparatus of any one of examples 1-2 and/or some other examples herein, wherein the inductor is a spiral inductor.

Example 9 may include the electronic apparatus of any one of examples 1-2 and/or some other examples herein, wherein the inductor is an air core inductor (ACI).

Example 10 may include the electronic apparatus of any one of examples 1-2 and/or some other examples herein, wherein the inductor is a component in a fully integrated voltage regulator (FIVR) or a multi-chip integrated voltage regulator (McIVR).

Example 11 may include the electronic apparatus of any one of examples 1-2 and/or some other examples herein, wherein the electronic apparatus comprises a wearable device, a smartphone, or an Internet of Things (TOT) device, and the inductor is a component in an integrated voltage regulator (IVR) on a system-on-chip (SoC).

Example 12 may include a printed circuit board (PCB), comprising: a substrate; and a ground layer on the substrate, wherein the ground layer includes a void area, wherein the void area is disposed at a location that substantially overlaps along a contour of an inductor within a circuit package, when the circuit package is affixed to the PCB.

Example 13 may include the PCB of example 12 and/or some other examples herein, wherein the ground layer includes a conductive metal or an alloy of metal.

Example 14 may include the PCB of example 12 and/or some other examples herein, wherein the ground layer is a top metal layer of the PCB that is closest to the inductor.

Example 15 may include the PCB of example 12 and/or some other examples herein, further comprising: a power layer below the ground layer, or a signal layer below the ground layer.

Example 16 may include the PCB of any one of examples 12-15 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 17 may include the PCB of any one of examples 12-15 and/or some other examples herein, wherein the inductor includes a first coil segment and a second coil segment disjoint from the first coil segment, and the ground layer includes a first void area and a second void area, and wherein the first void area substantially overlaps along a contour of the first coil segment, and the second void area substantially overlaps along a contour of the second coil segment.

Example 18 may include a computing device, comprising: a processor; a display coupled to the processor, a circuit package with an inductor; and a printed circuit board (PCB), wherein the circuit package is affixed to the PCB, the PCB has a plurality of layers including a ground layer and a power layer, and wherein the ground layer is between the power layer and the inductor, the ground layer includes a mesh area that is substantially void along a contour of the inductor.

Example 19 may include the computing device of example 18 and/or some other examples herein, wherein the ground layer includes a conductive metal or an alloy of metal.

Example 20 may include the computing device of any one of examples 18-19 and/or some other examples herein, wherein the ground layer is a top metal layer of the PCB that is closest to the inductor.

Example 21 may include the computing device of any one of examples 18-19 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 22 may include the computing device of any one of examples 18-19 and/or some other examples herein, wherein the inductor includes a first coil segment and a second coil segment disjoint from the first coil segment, and the ground layer includes a first mesh area and a second mesh area, and wherein the first mesh area is substantially void along a contour of the first coil segment, and the second mesh area is substantially void along a contour of the second coil segment.

Example 23 may include the computing device of any one of examples 18-19 and/or some other examples herein, wherein the inductor is an air core inductor (ACI).

Example 24 may include the computing device of any one of examples 18-19 and/or some other examples herein, wherein the inductor is a component in a fully integrated voltage regulator (FIVR) or a multi-chip integrated voltage regulator (McIVR).

Example 25 may include the computing device of any one of examples 18-19 and/or some other examples herein, wherein the computing device is a wearable device, a smartphone, or an Internet of Things (TOT) device, and the inductor is a component in an integrated voltage regulator (IVR) on a system-on-chip (SoC).

Example 26 may include a method for forming an electronic apparatus, comprising: forming a circuit package with an inductor; forming a printed circuit board (PCB) including a ground layer and a power layer, where the ground layer includes a mesh area that is substantially void along a contour of the inductor; and affixing the circuit package to the PCB, where the ground layer is between the power layer and the inductor.

Example 27 may include the method of example 26 and/or some other examples herein, wherein the ground layer includes a conductive metal or an alloy of metal.

Example 28 may include the method of any one of examples 26-27 and/or some other examples herein, wherein the ground layer is a top metal layer of the PCB that is closest to the inductor.

Example 29 may include the method of any one of examples 26-27 and/or some other examples herein, wherein the PCB further includes a signal layer located at a same side of the ground layer as the power layer is located.

Example 30 may include the method of any one of examples 26-27 and/or some other examples herein, wherein the PCB is of a circular shape, a square, a rectangular shape, an elliptical shape, or a polygon shape.

Example 31 may include the method of any one of examples 26-27 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 32 may include the method of any one of examples 26-27 and/or some other examples herein, wherein the inductor includes a first coil segment and a second coil segment disjoint from the first coil segment, and the ground layer includes a first mesh area and a second mesh area, and wherein the first mesh area is substantially void along a contour of the first coil segment, and the second mesh area is substantially void along a contour of the second coil segment.

Example 33 may include the method of any one of examples 26-27 and/or some other examples herein, wherein the inductor is a spiral inductor.

Example 34 may include the method of any one of examples 26-27 and/or some other examples herein, wherein the inductor is an air core inductor (ACI).

Example 35 may include the method of any one of examples 26-27 and/or some other examples herein, wherein the inductor is a component in a fully integrated voltage regulator (FIVR) or a multi-chip integrated voltage regulator (McIVR).

Example 36 may include one or more computer-readable media having instructions for a computer device to form an electronic apparatus, upon execution of the instructions by one or more processors, to perform the method of any one of examples 26-35.

Example 37 may include an apparatus for forming an electronic apparatus, comprising: means for forming a circuit package with an inductor; means for forming a printed circuit board (PCB) including a ground layer and a power layer, where the ground layer includes a mesh area that is substantially void along a contour of the inductor; and means for affixing the circuit package to the PCB, where the ground layer is between the power layer and the inductor.

Example 38 may include the apparatus of example 37 and/or some other examples herein, wherein the ground layer includes a conductive metal or an alloy of metal.

Example 39 may include the apparatus of any one of examples 37-38 and/or some other examples herein, wherein the ground layer is a top metal layer of the PCB that is closest to the inductor.

Example 40 may include the apparatus of any one of examples 37-38 and/or some other examples herein, wherein the PCB further includes a signal layer located at a same side of the ground layer as the power layer is located.

Example 41 may include the apparatus of any one of examples 37-38 and/or some other examples herein, wherein the PCB is of a circular shape, a square, a rectangular shape, an elliptical shape, or a polygon shape.

Example 42 may include the apparatus of any one of examples 37-38 and/or some other examples herein, wherein the circuit package comprises one of: a chip scale package (CSP), a wafer-level package (WLP), a quad-flat no-leads (QFN) package, a dual-flat no-leads (DFN) package, or a package with overmold mounted on the PCB.

Example 43 may include the apparatus of any one of examples 37-38 and/or some other examples herein, wherein the inductor includes a first coil segment and a second coil segment disjoint from the first coil segment, and the ground layer includes a first mesh area and a second mesh area, and wherein the first mesh area is substantially void along a contour of the first coil segment, and the second mesh area is substantially void along a contour of the second coil segment.

Example 44 may include the apparatus of any one of examples 37-38 and/or some other examples herein, wherein the inductor is a spiral inductor.

Example 45 may include the apparatus of any one of examples 37-38 and/or some other examples herein, wherein the inductor is an air core inductor (ACI).

Example 46 may include the apparatus of any one of examples 37-38 and/or some other examples herein, wherein the inductor is a component in a fully integrated voltage regulator (FIVR) or a multi-chip integrated voltage regulator (McIVR).

Although certain embodiments have been illustrated and described herein for purposes of description this application is intended to cover any adaptations or variations of the embodiments discussed herein. Therefore, it is manifestly intended that embodiments described herein be limited only by the claims.

What is claimed is:

1. An electronic apparatus, comprising:
    a circuit package with an inductor, wherein the inductor includes a coil;
    a printed circuit board (PCB), wherein the circuit package is affixed to the PCB, the PCB has a plurality of layers including a ground layer and a power layer, and wherein the ground layer is between the power layer and the inductor, the ground layer includes a mesh area that is substantially void along a contour of the inductor, the mesh area includes a void area with a shape substantially identical to a shape of the coil, and the void area is disposed at a location that substantially overlaps along the coil of the inductor.

2. The electronic apparatus of claim 1, wherein the ground layer includes a conductive metal or an alloy of metal.

3. The electronic apparatus of claim 1, wherein the ground layer is a top metal layer of the PCB that is closest to the inductor.

4. The electronic apparatus of claim 1, wherein the PCB further includes a signal layer located at a same side of the ground layer as the power layer is located.

5. The computing device of claim 1, wherein the PCB is of a circular shape, a square, a rectangular shape, an elliptical shape, or a polygon shape.

6. The electronic apparatus of claim 1, wherein the circuit package comprises one of: a chip scale package (CSP), a wafer-level package (WLP), a quad-flat no-leads (QFN) package, a dual-flat no-leads (DFN) package, or a package with overmold mounted on the PCB.

7. The electronic apparatus of claim 1, wherein the coil is a first coil segment, the mesh area is a first mesh area, the inductor further includes a second coil segment disjointed from the first coil segment, and the ground layer further includes a second mesh area, and wherein the second mesh area is substantially void along a contour of the second coil segment.

8. The electronic apparatus of claim 1, wherein the inductor is a spiral inductor.

9. The electronic apparatus of claim 1, wherein the inductor is an air core inductor (ACI).

10. The electronic apparatus of claim 1, wherein the inductor is a component in a fully integrated voltage regulator (FIVR) or a multi-chip integrated voltage regulator (McIVR).

11. The electronic apparatus of claim 1, wherein the electronic apparatus comprises a wearable device, a smartphone, or an Internet of Things (IOT) device, and the inductor is a component in an integrated voltage regulator (IVR) on a system-on-chip (SoC).

12. A printed circuit board (PCB), comprising:
    a substrate; and
    a ground layer on the substrate, wherein the ground layer includes a void area, wherein the void area is disposed at a location that substantially overlaps along a coil segment of an inductor within a circuit package, and the void area has a shape substantially identical to a shape of the coil segment, when the circuit package is affixed to the PCB.

13. The PCB of claim 12, wherein the ground layer includes a conductive metal or an alloy of metal.

14. The PCB of claim 12, wherein the ground layer is a top metal layer of the PCB that is closest to the inductor.

15. The PCB of claim 12, further comprising:
    a power layer below the ground layer, or a signal layer below the ground layer.

16. The PCB of claim 12, wherein the circuit package comprises one of: a chip scale package (CSP), a wafer-level package (WLP), a quad-flat no-leads (QFN) package, a dual-flat no-leads (DFN) package, or a package with overmold mounted on the PCB.

17. The PCB of claim 12, wherein the coil segment is a first coil segment, the void area is a first void area, and the inductor further includes a second coil segment disjointed from the first coil segment, and the ground layer includes a second void area, and wherein the second void area substantially overlaps along a contour of the second coil segment.

18. A computing device, comprising:
 a processor;
 a display coupled to the processor,
 a circuit package with an inductor, wherein the inductor includes a coil; and
 a printed circuit board (PCB), wherein the circuit package is affixed to the PCB, the PCB has a plurality of layers including a ground layer and a power layer, and wherein the ground layer is between the power layer and the inductor, the ground layer includes a mesh area that is substantially void along a contour of the inductor, the mesh area includes a void area with a shape substantially identical to a shape of the coil, and the void area is disposed at a location that substantially overlaps along the coil of the inductor.

19. The computing device of claim 18, wherein the ground layer includes a conductive metal or an alloy of metal.

20. The computing device of claim 18, wherein the ground layer is a top metal layer of the PCB that is closest to the inductor.

21. The computing device of claim 18, wherein the circuit package comprises one of: a chip scale package (CSP), a wafer-level package (WLP), a quad-flat no-leads (QFN) package, a dual-flat no-leads (DFN) package, or a package with overmold mounted on the PCB.

22. The computing device of claim 18, wherein the coil is a first coil segment, the mesh area is a first mesh area, and the inductor further includes a second coil segment disjointed from the first coil segment, and the ground layer includes a second mesh area, and wherein the second mesh area is substantially void along a contour of the second coil segment.

23. The computing device of claim 18, wherein the inductor is an air core inductor (ACI).

24. The computing device of claim 18, wherein the inductor is a component in a fully integrated voltage regulator (FIVR) or a multi-chip integrated voltage regulator (McIVR).

25. The computing device of claim 18, wherein the computing device is a wearable device, a smartphone, or an Internet of Things (TOT) device, and the inductor is a component in an integrated voltage regulator (IVR) on a system-on-chip (SoC).

* * * * *